US011158666B2

(12) United States Patent
Tu et al.

(10) Patent No.: US 11,158,666 B2
(45) Date of Patent: Oct. 26, 2021

(54) MULTIPLE WAVELENGTH LIGHT-EMITTING DIODE EPITAXIAL STRUCTURE WITH ASYMMETRIC MULTIPLE QUANTUM WELLS

(71) Applicant: EPILEDS TECHNOLOGIES, INC., Tainan (TW)

(72) Inventors: Jiun-Wei Tu, Kaohsiung (TW); Wei-Yu Tseng, Kaohsiung (TW); Tetsuya Gouda, Himeji (JP)

(73) Assignee: EPILEDS TECHNOLOGIES, INC., Tainan (TW)

( * ) Notice: Subject to any disclaimer, the term of this patent is extended or adjusted under 35 U.S.C. 154(b) by 0 days.

(21) Appl. No.: 16/423,573

(22) Filed: May 28, 2019

(65) Prior Publication Data

US 2020/0212099 A1 Jul. 2, 2020

(30) Foreign Application Priority Data

Dec. 28, 2018 (TW) .................................. 107147688

(51) Int. Cl.
*H01L 27/15* (2006.01)
*H01L 33/06* (2010.01)
*H01L 33/32* (2010.01)

(52) U.S. Cl.
CPC ............ *H01L 27/153* (2013.01); *H01L 33/06* (2013.01); *H01L 33/32* (2013.01)

(58) Field of Classification Search
CPC ....... H01L 27/153; H01L 33/06; H01L 33/32; H01L 25/0756; H01L 33/0004; H01L 33/02; H01L 33/08
See application file for complete search history.

(56) References Cited

U.S. PATENT DOCUMENTS 8,314,429 B1 * 11/2012 Raring .................... H01L 33/32
257/76

FOREIGN PATENT DOCUMENTS

| CN | 102169885 A | 8/2011 |
| TW | 200709522 | 3/2007 |
| TW | 201807815 | 3/2018 |

\* cited by examiner

*Primary Examiner* — Andrew Q Tran
(74) *Attorney, Agent, or Firm* — Muncy, Geissler, Olds & Lowe, P.C.

(57) ABSTRACT

A multi-wavelength light-emitting diode epitaxial structure comprises of a substrate and at least three light-emitting elements, wherein the light-emitting elements are sequentially stacked on the substrate. For each two adjacent light-emitting elements, the light-emitting element disposed closer to the light-exiting surface has a higher bandgap than that of the light-emitting element disposed farther from the light-exiting surface. Each of the light-emitting elements comprises of an active layer and two cladding layers disposed on two opposite sides of the active layer, and each active layer includes a multiple quantum well structure. Cladding layers of different refractive indexes are arranged incrementally from the substrate to the light-exiting surface. Any given two adjacent cladding layers from two light-emitting elements have a combined thickness of 1 μm or less. The emission wavelengths of the light-emitting elements are ultraviolet or infrared bands.

12 Claims, 4 Drawing Sheets

MULTIPLE WAVELENGTH LIGHT-EMITTING DIODE EPITAXIAL STRUCTURE WITH ASYMMETRIC MULTIPLE QUANTUM WELLS

CROSS-REFERENCE TO RELATED APPLICATION

This application claims priority from Taiwan Patent Application No. 107147688, filed on Dec. 28, 2018 in Taiwan Intellectual Property Office, the disclosures of which are hereby incorporated by reference in their entirety for all purposes.

BACKGROUND OF THE INVENTION

1. Field of the Invention

The present invention relates to a light-emitting diode, and particularly to a light-emitting diode epitaxial structure with multiple wavelengths.

2. Description of the Related Art

A light-emitting diode is a semiconductor electronic component which emits light with a very small current, and the lifespan of the light-emitting diode is prolonged compared to other light sources. Current light-emitting diode technology already enables lights of wide spectrum containing visible light, infrared light and ultraviolet light. Since the luminous intensity has achieved a desirable level, more and more products are adopting to light-emitting diodes as their sources of lighting. Common applications include white light illuminations, liquid-Crystal Display (LCD) backlights, projector light sources and outdoor displays. Light-emitting diodes are widely applied in daily life and gradually substituting conventional light sources.

The semiconductor material of the light-emitting diode is generally an alloy compound of group III and group IV elements. Through selecting different materials, energy levels occupied with electrons/holes are different, and such differences between energy levels affect photon energies generated from recombination of electrons and holes. As a result, light with different wavelengths are generated and thus different color are revealed, such as red, orange, yellow, green, blue or ultraviolet lights. More colors may be generated by mixing light-emitting diodes of different colors.

Currently, the light-emitting diode epitaxial structure includes a single active layer in most cases, and few may include two active layers at most. Therefore, a light-emitting diode emits lights with a single wavelength or two wavelengths at most. The emission wavelength is restricted by the material property, hence the light emission spectrum of existing light-emitting diode is limited. When a light containing different wavelengths is desired, different types of light-emitting diodes are required to generate light with multiple wavelengths accordingly. It does not only increase production cost, but also put restrictions in product design.

SUMMARY OF THE INVENTION

The present invention provides a multiple wavelength light-emitting diode epitaxial structure with the intention to solve the aforementioned problem in prior art. The present invention includes a substrate and at least three light-emitting elements, where in the light-emitting elements are stacked on the substrate. Between two adjacent light-emitting elements, the bandgap of the light-emitting element disposed closer to the light-exiting surface is higher than the bandgap of the light-emitting element disposed distant from the light-exiting surface.

Preferably, each of the light-emitting elements includes an active layer, wherein the active layer comprises a multiple quantum well structure (MQW).

Preferably, at least one of said light-emitting elements further comprises a first cladding layer and a second cladding layer, the active layer is sandwiched therebetween and the first cladding layer and the second layer that have different thicknesses.

Alternatively, at least one of said light-emitting elements further comprises a first cladding layer and a second cladding layer, the active layer is sandwiched therebetween and the first cladding layer and the second layer that have same thicknesses.

Preferably, between two adjacent light-emitting elements respectively having first cladding layers and the second cladding layers, the refractive index of the first cladding layer and the second cladding layer of the light-emitting element closer to the light-exiting surface is higher than the refractive index of the first cladding layer and the second cladding layer of the light-emitting element disposed distant from the light-exiting surface. Within a light-emitting element, the refractive index of a cladding layer disposed closer to the light-exiting surface is higher than the refractive index of another cladding layer disposed distant from the light-exiting surface.

Preferably, the first cladding layer and the second cladding layer respectively correspond to the electron/hole injection layer, transport layer, confining layer or combination thereof.

Preferably, materials of the active layer, first cladding layer and second cladding layer are respectively selected from Al, Ga, In, N, As and P.

Preferably, the emission wavelength of the multiple wavelength light-emitting diode epitaxial structure is ultraviolet light band or infrared light band.

Preferably, the total thickness of the adjacent first cladding layer and second cladding layer is 1 μm or less.

Preferably, the substrate may include a carrier substrate or a renewed substrate.

Preferably, there is an adhesive layer between the substrate and the neighboring light-emitting element.

The multiple wavelength light-emitting diode epitaxial structure according to the present invention emits light comprising different wavelength, and covers a broader range of emission spectrum with a single light-emitting diode.

DESCRIPTION OF THE PREFERRED EMBODIMENTS

The advantages, features, and technical methods of the present invention are explained in detail with reference to the exemplary embodiments and figures. The present invention may be realized in different forms and should not be construed as being limited to the embodiments mentioned herein.

Figure 1:
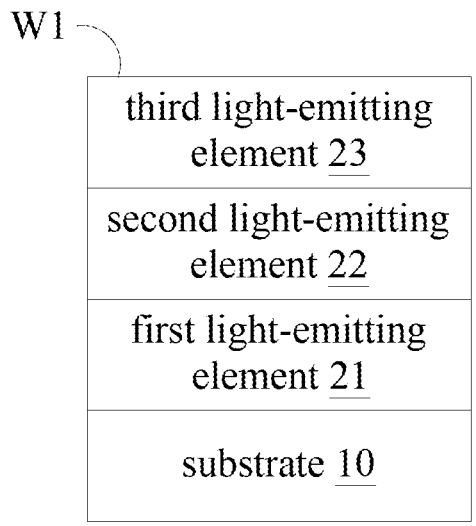
FIG. 1 depicts a schematic view of the first embodiment of the multiple wavelength light-emitting diode epitaxial structure according to the present invention.

Refer to FIG. 1, which depicts a schematic view of the first embodiment of the multiple wavelength light-emitting diode epitaxial structure according to the present invention. The multiple wavelength light-emitting diode epitaxial structure 1 comprises of a substrate 10 and three light-emitting elements: a first light-emitting element 21, a second light-emitting element 22 and a third light-emitting element 23. The first light-emitting element 21, the second light-emitting element 22 and the third light-emitting element 23 are disposed on the substrate 10 in a stacking order. Each of the light-emitting elements respectively emits light when receiving energy of semiconductor bandgap corresponding to the light-emitting element.

Between two adjacent light-emitting elements, the bandgap of the light-emitting element disposed closer to the light-exiting surface is higher than the bandgap of the light-emitting element disposed distant from the light-exiting surface. In this embodiment, the third light-emitting element 23 is disposed closer to the light-exiting surface W1, the second light-emitting element 22 is disposed further from the light-exiting surface W1, and the first light-emitting element 21 is disposed even further from the light-exiting surface W1. Therefore, the bandgap of the third light-emitting element 23 is higher than the bandgap of the second light-emitting element 22; and the bandgap of the second light-emitting element 22 is higher than the bandgap of first light-emitting element 21. In this embodiment, the bandgaps of the first light-emitting element 21, the second light-emitting element 22 and the third light-emitting element 23 are between 0.64 eV and 1.707 eV. In another preferred embodiment, the bandgaps are between 0.512 eV and 5.12 eV. The bandgaps of the multiple wavelength light-emitting epitaxial structure according to the present invention are arranged incrementally towards the light-exiting surface. Light emitted by the light-emitting element distant from the light-exiting surface being absorbed is reduced. That is, the absorbed amount of the short wavelength (meaning high bandgap) while penetrating first layer is less, and the light extraction efficiency is improved.

The epitaxial method of the present invention may include conventional liquid phase epitaxy (LPE), vapor phase epitaxy (VPE), metal organic chemical vapor deposition (MOCVD), and molecular beam epitaxy (MBE).

The substrate 10 may be selected from at least one of the following: sapphire ($Al_2O_3$), diamond (C), silicon (Si), silicon carbide (SiC), aluminum nitride (AlN), aluminum gallium nitride (AlGaN), gallium arsenide (GaAs), gallium phosphide (GaP), gallium nitride (GaN) and zinc oxide (ZnO) or other alternative materials.

In this embodiment, the material of the light-emitting elements is selected from a III-V semiconductor group of Al, Ga, In, N, As and P. For example, the selected material of the light-emitting elements may be binary compound such as GaP, GaAs, GaN and InP; ternary compound such as AlGaAs, AlGaP, AlInP, GaAsP, InGaP, InGaAs, InGaN and AlGaN; quaternary compound such as AlInGaP, AlInGaN, AlInGaAs, InGaAsP or combination thereof. However, the selected material of the light-emitting elements of the present invention is not limited to aforementioned.

In this embodiment, the first light-emitting element 21, the second light-emitting element 22 and the third light-emitting element 23 respectively comprises an active layer, and the active layer includes a multiple quantum well (MQW) structure. Wherein the MQW comprises a plurality of the well layers and/or the barrier layers that are interstacked with each other. In this embodiment, the well layers are disposed between barrier layers, and the number of stacked well layers and barrier layers is lower than fifty (50). The number of stacked layers is between ten (10) and forty (40) in another preferred embodiment.

Figure 2:
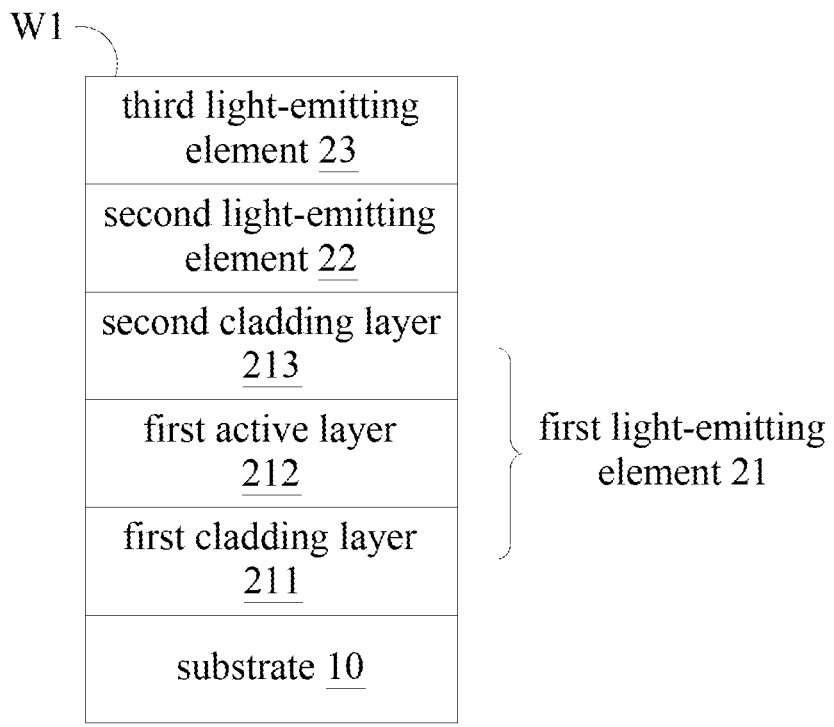
FIG. 2 depicts a schematic view of the second embodiment of the multiple wavelength light-emitting diode epitaxial structure according to the present invention.

Refer to FIG. 2, a schematic view of the second embodiment of the multiple wavelength light-emitting diode epitaxial structure according to the present invention. The difference between FIG. 1 and FIG. 2 is that the first light-emitting element 21 includes a first cladding layer 211, a first active layer 212 and a second cladding layer 213. Wherein the first active layer 212 has a MQW structure, same as in the active layers of the second light-emitting element 22 and the third light-emitting element 23. The bandgap of the active layer of the third light-emitting element 23 is higher than the bandgap of the active layer of the second light-emitting element 22; and the bandgap of the active layer of the second light-emitting element 22 is higher than the bandgap of the first active layer 212.

In this embodiment, the first light-emitting element 21 comprises of the first cladding layer 211, the active layer 212 and the second cladding layer 213; wherein the second cladding layer 213 is disposed on one side of the active layer 212 closer to the light-exiting surface W1, and the first cladding layer 211 is disposed on the opposite side of the active layer 212 distant from the light-exiting surface W1. Wherein the refractive index of the second cladding layer 213 is higher than the refractive index of the first cladding layer 211. The refractive indexes of the multiple wavelength light-emitting epitaxial structure according to the present invention are arranged incrementally towards the light-exiting surface W1. Lights emitted by the light-emitting elements distant from the light-exiting surface W1 being reflected is reduced. That is, the light emitted from the layers distant from the light-exiting surface W1 is less reflected, and the light extraction efficiency is improved. In this embodiment, the refractive indexes of the first cladding layer 211 and the second cladding layer 213 may be between 1 and 5.

The first cladding layer 211 and the second cladding layer 213 respectively correspond to the electron/hole injection layer, the electron/hole transport layer, the electron/hole confining layer or combination thereof. The materials of the first cladding layer 211 and the second cladding layer 213 may be selected from the materials of the light-emitting element as described in FIG. 1. The first cladding layer 211 and the second cladding layer 213 are p-type and n-type semiconductors respectively.

In this embodiment, the emission wavelengths of the first active layer 212, the active layer of the second light-emitting element 22 and the active layer of the third light-emitting element 23 are between 200 nm and 2000 nm. In other preferred embodiments, the emission wavelength may be ultraviolet light or infrared light within the bandwidth aforementioned. Light-emitting elements with different wavelengths are arranged incrementally towards the light-exiting surface W1. So that the absorption of lights from light-emitting elements further from the light-exiting surface W1 is reduced and light extraction efficiency is improved.

Figure 3:
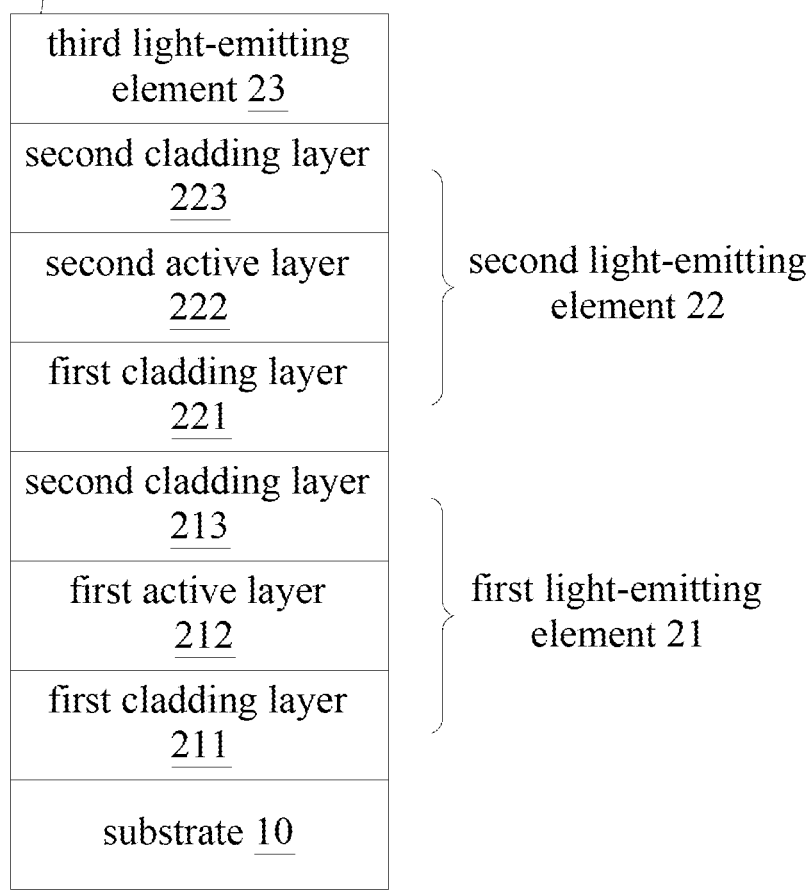
FIG. 3 depicts a schematic view of the third embodiment of the multiple wavelength light-emitting diode epitaxial structure according to the present invention.

With reference to FIG. 3, the third embodiment of the multiple wavelength light-emitting diode epitaxial structure according to the present invention is illustrated. The difference between FIG. 1 and FIG. 3 is that the first light-emitting element 21 comprises of a first cladding layer 211, a first active layer 212 and a second cladding layer 213. The second light-emitting element 22 comprises of a first cladding layer 221, a second active layer 222 and a second cladding layer 223, wherein the first active layer 212, the second active layer 222 and the active layer of the third light-emitting element 23 all have MQW structures. The bandgap of the active layer of the third light-emitting element 23 is higher than the bandgap of the second active layer 222 and the bandgap of the second active layer 222 is higher than the bandgap of the first active layer 212.

In this embodiment, the refractive index of the first cladding layer 221 and the second cladding layer 223 of the second light-emitting element 22 disposed closer to the light-exiting surface W1 is higher than the refractive index of the first cladding layer 211 and the second cladding layer 213 of the first light-emitting element 21 disposed distant from the light-exiting surface W1. Within the same light-emitting element, the refractive index of the second cladding layer 223 disposed closer to the light-exiting surface W1 is higher than the refractive index of the first cladding layer 221 disposed distant from the light-exiting surface W1, and the refractive index of the second cladding layer 213 disposed closer to the light-exiting surface W1 is higher than the refractive index of the first cladding layer 211 disposed further from the light-exit surface W1. Therefore, the refractive index of the foregoing layers is in following orders: the second cladding layer 223>the first cladding layer 221>the second cladding layer 213>the first cladding layer 211.

The refractive index of the cladding layer may be adjusted by varying doping materials with different refractive indexes such as silicon nitric oxide, oxide and fluoride with Al, Li, Ca, Mg, oxide with Ti, Hf, Sn, Sb, Zr, Ta, Mn, ZnS, the III-oxide, the III-arsenide and the III-phosphide, and by adjusting the compound or alloy proportion of the dopants aforementioned.

Figure 4:
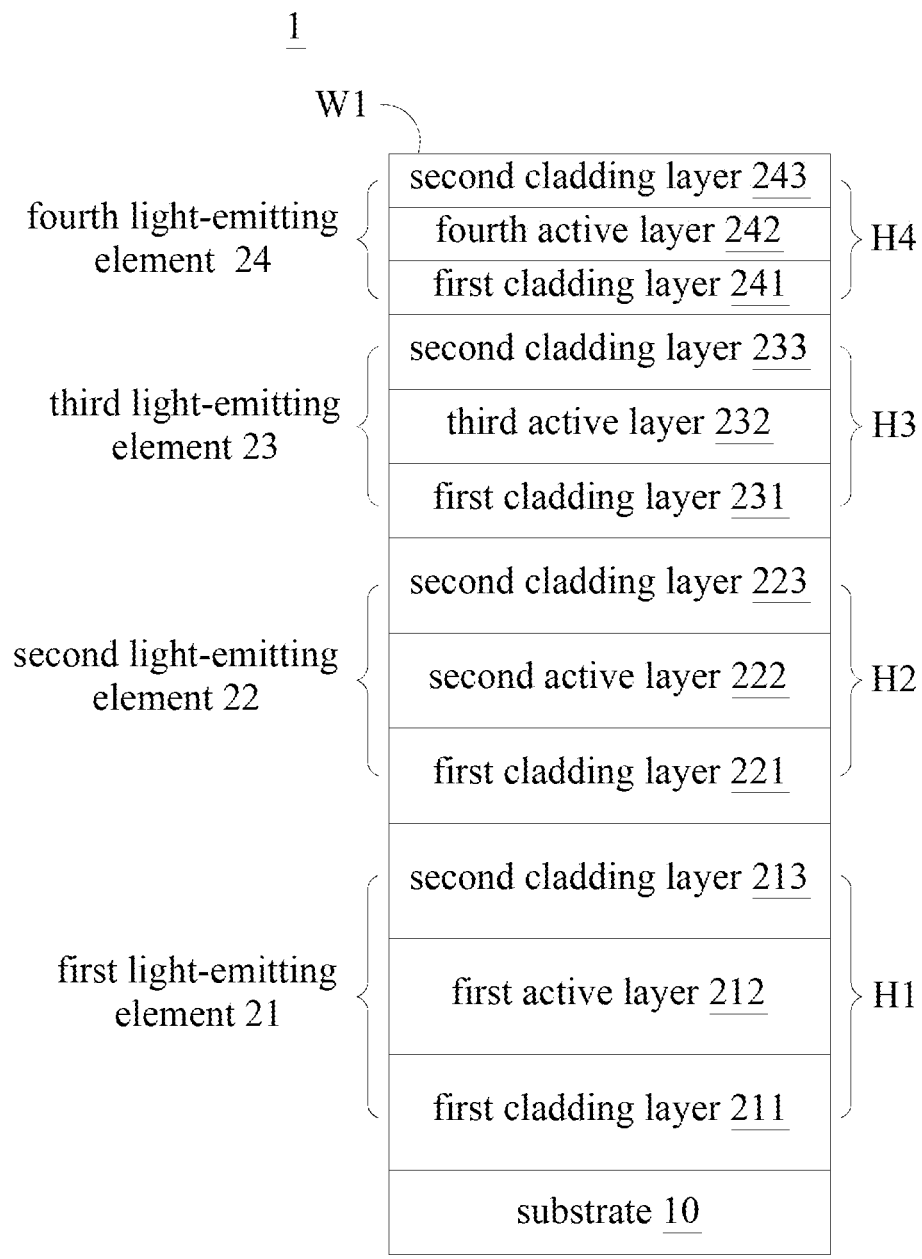
FIG. 4 depicts a schematic view of the fourth embodiment of the multiple wavelength light-emitting diode epitaxial structure according to the present invention.

With reference to FIG. 4, the fourth embodiment of the multiple wavelength light-emitting diode epitaxial structure according to the present invention is illustrated. The difference between FIG. 1 and FIG. 4 is that a fourth light-emitting element 24 is further included and each light-emitting element has a first cladding layer and a second cladding layer. The variation of the bandgaps, refractive indexes, and cladding layer types and thicknesses of the stacked light-emitting elements in the multiple wavelength light-emitting diode epitaxial structure according to the present invention are described with reference to FIG. 4.

Referring to FIG. 4, the multiple wavelength light-emitting diode epitaxial structure according to the present invention includes four light-emitting elements, namely first light-emitting element 21, second light-emitting element 22, third light-emitting element 23 and fourth light-emitting element 24. The first light-emitting element 21 comprises of a first cladding layer 211, a first active layer 212 and a second cladding layer 213. The second light-emitting element 22 comprises of a first cladding layer 221, a second active layer 222 and a second cladding layer 223. The third light-emitting element 23 comprises of a first cladding layer 231, a third active layer 232 and a second cladding layer 233. The fourth light-emitting element 24 comprised of a first cladding layer 241, a fourth active layer 242 and a second cladding layer 243. The foregoing layers are stacked on a substrate 10 in an order, wherein the first active layer 212, the second active layer 222, the third active layer 232 and the fourth active layer 242 all have MQW structures. The bandgaps are arranged in the following order: the fourth active layer 242>the third active layer 232>the second active layer 222>the first active layer 212. Therefore, the bandgap of the active layer disposed closer to the light-exiting surface W1 is higher. In this embodiment, the bandgap of the first active layer 212, the second active layer 222, the third active layer 232 and the fourth active layer 242 are between 0.64 eV and 1.7 eV, and may be between 0.512 eV to 5.12 eV in other preferred embodiments.

The light-exiting surface W1 is above the second cladding layer 243. The refractive indexes of the first cladding layer 241 and the second cladding layer 243 of the fourth light-emitting element 24 disposed closer to the light-exiting surface W1 are higher than the refractive indexes of the first cladding layer 211 and the second cladding layer 213 of the first light-emitting element 21 disposed further from the light-exiting surface W1. Further, within the same light-emitting element, the refractive index of a cladding layer disposed closer to the light-exiting surface W1 is higher than the refractive index of another cladding layer disposed distant from the light-exiting surface W1. Therefore, the refractive indexes of the foregoing layers are arranged in the following order: the second cladding layer 243>the first cladding layer 241>the second cladding layer 233>the first cladding layer 231>the second cladding layer 223>the first cladding layer 221>the second cladding layer 213>the first cladding layer 211.

Aside from affecting the illumination direction by modifying dopant materials and/or compositions to adjust the refractive indexes, it is also possible to affect the illumination direction by modifying positions of internal reflective materials in first and second cladding layers of a light-emitting element to form a total reflective optical path. Alternatively, modifying positions of reflective materials of first and second cladding layers of each light-emitting element to form a waveguide structure may also adjust the illumination direction. Another alternative is to further increase light extraction of the light-emitting element by selectively treating the first and second cladding surface using wet or dry roughening methods.

In this embodiment, the first cladding layer and the second cladding layer may correspond to the electron/hole injection layer, the electron/hole transport layer, the electron/hole confining layer or combination thereof. In the multiple wavelength light-emitting diode epitaxial structure 1 according to the present invention, a first cladding layer and a second cladding layer are of different light-emitting elements but disposed adjacently and having different carrier properties. For example, when the second cladding layer 213 is an electron injection layer and/or electron transport layer, the first cladding layer 221 would be a hole injection layer and/or hole transport layer. Therefore, the interface between the first cladding layer 221 and the second cladding layer 213 where they are disposed adjacently with each other forms a P/N interface. At the same time, the first cladding layer 231 and the second cladding layer 223 are disposed adjacently with each other. Should the second cladding layer 223 be the electron injection layer and/or the electron transport layer, the first cladding layer 231 would be the hole injection layer and/or the hole transport layer. Similarly, between adjacently disposed first cladding layer 241 and second cladding layer 233, the second cladding layer 233 is the electron injection layer and/or the electron transport layer if the first cladding layer 241 is the hole injection layer and/or the hole transport layer. Furthermore, the first and second cladding layers in the same light-emitting element also have different carrier properties. For example, in a light-emitting element, the first cladding layer is the electron injection layer and/or the electron transport layer, the second cladding layer will be the hole injection layer and/or the hole transport layer. Hence the amount of electrons/holes being injected into the first cladding layer and the second cladding layer in the same light-emitting element are respectively increased and the overall electro-optical efficiency is improved.

With regards to semiconductor materials for the first and second cladding layers, the p-type dopant may comprise of Mg, Be, Zn, C or combination thereof, and the n-type dopant may comprise Si, P, As, Sb or combination thereof.

In this embodiment, the thickness of each light-emitting elements is incremental from the light-exiting surface W1 afar therefrom. Referring to FIG. 4, H1 is the entire thickness of the first light-emitting element 21, H2 is the entire thickness of the second light-emitting element 22, H3 is the entire thickness of the third light-emitting element 23, H4 is the entire thickness of the fourth light-emitting element 24, and the light-exiting surface W1 is on top of the fourth light-emitting element 24. The thicknesses of the four light-emitting elements are arranged in following order: H1>H2>H3>H4. The bandgap of each light-emitting element may be further adjusted by variations of the thicknesses of light-emitting elements. Since each light-element includes a first cladding layer and a second cladding layer, thicknesses of the two cladding layers may be the same or different.

Figure 5:
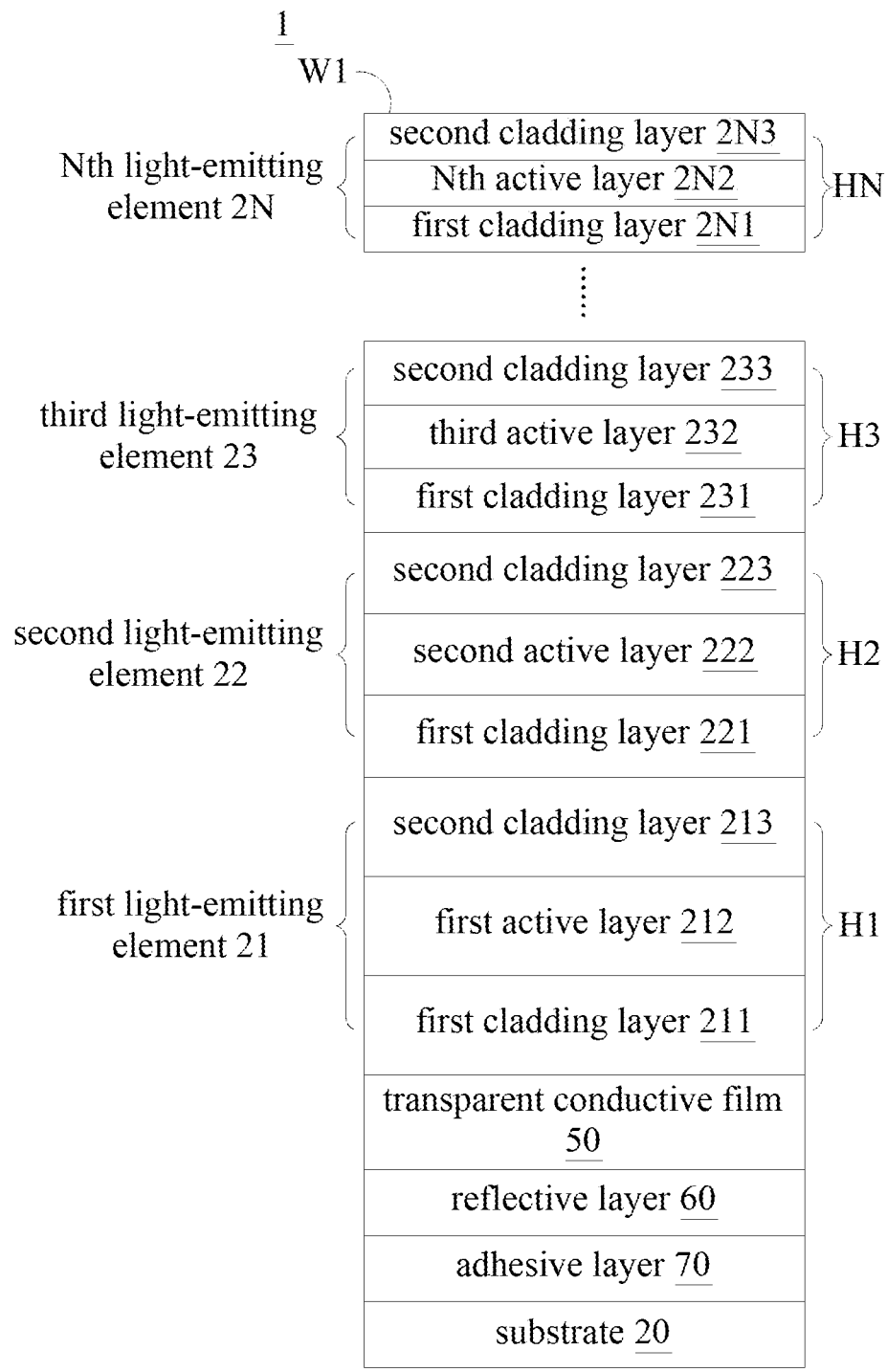
FIG. 5 depicts a schematic view of the fifth embodiment of the multiple wavelength light-emitting diode epitaxial structure according to the present invention.

With reference to FIG. 5, a schematic view of the fifth embodiment of the multiple wavelength light-emitting diode epitaxial structure according to the present invention. In this embodiment, the multiple wavelength light-emitting diode epitaxial structure comprises of a substrate 20, an adhesive layer 70, a reflective layer 60, a transparent conductive film 50 and a plurality of the light-emitting elements stacked on the transparent conductive film 50 in an order. The number of light-emitting elements is at least three, namely the first light-emitting element 21, the second light-emitting element 22, the third light-emitting element 23 . . . , the Nth light-emitting element 2N.

The first light-emitting element 21 comprises of a first cladding layer 211, a first active layer 212 and a second cladding layer 213. The second light-emitting element 22 comprises of a first cladding layer 221, a second active layer 222 and a second cladding layer 223. The third light-emitting element 23 comprises of a first cladding layer 231, a third active layer 232 and a second cladding layer 233 . . . . The Nth light-emitting element 2N comprises of a first cladding layer 2N1, a Nth active layer 2N2 and a second cladding layer 2N3. The bandgaps of the first active layer 212, second active layer 222, third active layer 232 . . . , Nth active layer 2N2 are arranged in following order: Nth active layer 2N2> . . . >third active layer 232>the second active layer 222>the first active layer 212, wherein N is an integer greater than 3. For example, when there are five light-emitting elements in the multiple wavelength light-emitting diode epitaxial structure 1, there will be a fourth light-emitting element 24 and a fifth light-emitting element 25.

In this embodiment, the combined thickness of a first cladding layer and a second cladding layer disposed adjacently is 1 μm or less. For example, the combined thickness of the first cladding layer 221 and the second cladding layer 213 is 1 μm or less, and the combined thickness of the first cladding layer 231 and the second cladding layer 223 is 1 μm or less.

The transparent conductive film 50 includes, silver nanowires, silver nanoparticle, gold nanoparticle, gold nanowires deposited to a predetermined thickness and conductivity. Other metal oxide material may be further included selectively, such as ITO, InO, SnO, CTO, ATO, AZO, ZTO, GZO, ZnO, GaP, IZO, DLC, IGO, GAZO, Graphene or mixture thereof. The thickness and conductivity of the transparent conductive film 50 may be adjusted by increasing or decreasing the density of the silver nanowires or other nanoinaterials during production. The transparent conductive film 50 can lower the current crowding effect and allow the current to spread evenly to the multiple wavelength light-emitting diode epitaxial structure according to present invention.

In this embodiment, a reflective layer 60 is disposed below the transparent conductive film 50. The material of the reflective layer 60 may comprise of Al, Al alloy, Au, In, Sn, Ti, Pt, Bi or combination thereof, or other highly reflective materials. A person having ordinary skill in the art is able to flexibly select materials of the reflective layer 60. Moreover, the thickness of the reflective layer 60 may be determined by the manufacturing process and the emission wavelength of the light-emitting element of the multiple wavelength light-emitting diode epitaxial structure 1 according to the present invention. The light from light-emitting elements to the reflective layer 60 is received and reflected towards the light-exiting surface W1, hence the light extraction efficiency is further improved.

In this embodiment, an adhesive layer 70 is disposed under the reflective layer 60 for adhering the substrate 20. The epitaxial growth sequence may also be reversed. For example, the growing order from the substrate can be from high bandgap light-emitting element to low bandgap light-emitting element. Starting epitaxial stacking from substrate, a Nth light-emitting element . . . , a third light-emitting element 23, a second light-emitting element 22 and a first light-emitting element 21. Once epitaxial growth is completed, an adhesive layer 70 is applied before being attached another substrate (also called carrier substrate) 20, then the original substrate is sub-sequentially removed.

The stacked light-emitting elements are therefore removed from the original substrate and transferred to another substrate (also called carrier substrate) 20. The light-emitting elements are now in a desired order on carrier substrate 20 where the highest bandgap light-emitting element is closest to the light-exiting surface W1 and lowest bandgap light-emitting element is furthest therefrom. The adhesive layer 70 does not only attach the substrate 20 to the reflective layer 60, but also reflects light penetrating through the reflective layer 60 towards the light-exiting surface W1. Moreover, the adhesive layer 70 enhances heat dispatching of the overall epitaxial structure, thus the normal operation are maintained while high currents are applied to the multiple wavelength epitaxial structure according to the present invention.

The epitaxial substrate and carrier substrate may be the same or different when the epitaxial growing sequence is reversed. In this embodiment, the epitaxial substrate and the carrier substrate are different, and the carrier substrate may be of materials having incompatible crystal lattice to the epitaxial materials, such as resin or epoxy. In other embodiments, the epitaxial substrate and the carrier substrate are the same. In other words, the same substrate is used in the epitaxial growth, having light-emitting elements removed, and then flipped to be used again. Such substrates are referred as renewable substrates.

In this embodiment, the multiple wavelength light-emitting diode epitaxial structure according to the present invention may further provide a tunneling layer to enhance electro-optical efficiency. Such tunneling layer is disposed between the second cladding layer 213 and the first cladding layer 221, between the second cladding layer 223 and the first cladding layer 231 . . . . The selection of material of such tunneling is the same as the active layer. Moreover, a window is disposed on the second cladding layer 2N3, and a contact layer is disposed between the transparent conductive film 50 and the first cladding layer 211, as well as on the window. The material of the contact layer may be selected from Al, Ga, or As.

In summary, the multiple wavelength light-emitting diode epitaxial structure according to the present invention combine at least three active layers, allow one single light-emitting diode to emit light of at least three emission wavelengths, cover a broader light spectrum to achieve mixing different light in a single light-emitting diode.

The present invention may be realized in different forms and should not be construed as being limited to the embodiments mentioned herein. It is to be understood that many other possible modifications and variations can be made by persons having ordinary skill in the art without departing from the spirit and scope of the invention as hereinafter claimed.

What is claimed is:

1. A multiple wavelength light-emitting diode epitaxial structure comprising:
   a substrate; and
   at least three light-emitting elements disposed on said substrate in a stacking order;
   wherein between adjacent two of said light-emitting elements, a bandgap of one of said light-emitting elements disposed closer to the light-exiting surface is higher than said bandgap of another one of said light-emitting element disposed farther from said light-exiting surface;
   wherein each of said light-emitting elements comprises an active layer, a first cladding layer and a second cladding layer, an emission wavelength of said active layer is in an ultraviolet light band or an infrared light band, and said active layer is sandwiched between said first cladding layer and said second cladding layer;
   wherein a combined thickness of said first cladding layer and said second cladding layer adjacent to each other is 1 μm or less.

2. The multiple wavelength light-emitting diode epitaxial structure of claim 1, wherein each said active layer includes a multiple quantum well structure.

3. The multiple wavelength light-emitting diode epitaxial structure of claim 2, wherein:
   said first and second cladding layers have different thicknesses.

4. The multiple wavelength light-emitting diode epitaxial structure of claim 3, wherein said first cladding layers and said second cladding layers are respectively provided between adjacent two of said light-emitting elements, refractive indexes of said first and second cladding layers of one of said light-emitting elements disposed closer to said light-exiting surface are higher than refractive indexes of said first and second cladding layers of another one of said light-emitting elements disposed farther from said light-exiting surface; and
   between said first cladding layer and said second cladding layer of same light-emitting element, the refractive index of one of said cladding layers disposed closer to said light-exiting surface is higher than the refractive index of another one of said cladding layers disposed farther from said light-exiting surface.

5. The multiple wavelength light-emitting diode epitaxial structure of claim 3, wherein said first cladding layer and said second cladding layer respectively correspond to electron/hole injection layer, electron/hole transport layer, electron/hole confining layer or combination thereof.

6. The multiple wavelength light-emitting diode epitaxial structure of claim 3, wherein said first cladding layer and said second cladding layer independently and respectively comprise of materials selected from Al, Ga, In, N, As and P.

7. The multiple wavelength light-emitting diode epitaxial structure of claim 2, wherein:
   said first and second cladding layers have a same thickness.

8. The multiple wavelength light-emitting diode epitaxial structure of claim 7, wherein said first cladding layers and said second cladding layers are respectively provided between adjacent two of said light-emitting elements, refractive indexes of said first and second cladding layers of one of said light-emitting elements disposed closer to said light-exiting surface are higher than refractive indexes of said first and second cladding layers of another one of said light-emitting elements disposed farther from said light-exiting surface; and
   between said first cladding layer and said second cladding layer of same light-emitting element, the refractive index of one of said cladding layers disposed closer to said light-exiting surface is higher than the refractive index of another one of said cladding layers disposed farther from said light-exiting surface.

9. The multiple wavelength light-emitting diode epitaxial structure of claim 7, wherein said first cladding layer and said second cladding layer respectively correspond to electron/hole injection layer, electron/hole transport layer, electron/hole confining layer or combination thereof.

10. The multiple wavelength light-emitting diode epitaxial structure of claim 7, wherein said first cladding layer and said second cladding layer independently and respectively comprise of materials selected from Al, Ga, In, N, As and P.

11. The multiple wavelength light-emitting diode epitaxial structure of claim 1, the substrate includes a carrier or transferring substrate.

12. The multiple wavelength light-emitting diode epitaxial structure of claim 1, wherein an adhesive layer is disposed between said substrate and said light-emitting element neighboring to the substrate.

* * * * *